(12) United States Patent
Behfar et al.

(10) Patent No.: US 7,972,879 B2
(45) Date of Patent: Jul. 5, 2011

(54) MULTI-LEVEL INTEGRATED PHOTONIC DEVICES

(75) Inventors: Alex A. Behfar, Ithaca, NY (US); Malcolm R. Green, Ithaca, NY (US); Alfred T. Schremer, Freeville, NY (US)

(73) Assignee: Binoptics Corporation, Ithaca, NY (US)

( * ) Notice: Subject to any disclaimer, the term of this patent is extended or adjusted under 35 U.S.C. 154(b) by 0 days.

(21) Appl. No.: 12/641,023

(22) Filed: Dec. 17, 2009

(65) Prior Publication Data

US 2010/0099209 A1      Apr. 22, 2010

Related U.S. Application Data

(62) Division of application No. 11/105,552, filed on Apr. 14, 2005, now Pat. No. 7,656,922.

(60) Provisional application No. 60/562,231, filed on Apr. 15, 2004.

(51) Int. Cl.
  *H01L 21/00* (2006.01)
  *H01L 21/45* (2006.01)
  *H01L 21/48* (2006.01)
  *H01L 21/50* (2006.01)

(52) U.S. Cl. .............. 438/29; 438/45; 438/712

(58) Field of Classification Search .......... 438/29, 438/46, 712; 257/E21.214
See application file for complete search history.

(56) References Cited

U.S. PATENT DOCUMENTS

| 5,987,046 A | * | 11/1999 | Kobayashi et al. | ........ 372/45.01 |
| 6,885,795 B1 | * | 4/2005 | Hsu et al. | ........ 385/48 |
| 6,940,885 B1 | * | 9/2005 | Cheng et al. | ........ 372/50.1 |

FOREIGN PATENT DOCUMENTS

| EP | 001017141 A2 * | 7/2000 |
| JP | 57-190516 | 12/1982 |
| JP | 3-266490 A | 11/1991 |
| JP | 4-104107 A | 4/1992 |

* cited by examiner

*Primary Examiner* — William M. Brewster
(74) *Attorney, Agent, or Firm* — Jones, Tullar & Cooper, P.C.

(57) ABSTRACT

A laser and electroabsorption modulator (EAM) are monolithically integrated through an etched facet process. Epitaxial layers on a wafer include a first layer for a laser structure and a second layer for an EAM structure. Strong optical coupling between the laser and the EAM is realized by using two 45-degree turning mirrors to route light vertically from the laser waveguide to the EAM waveguide. A directional angled etch process is used to form the two angled facets.

23 Claims, 7 Drawing Sheets

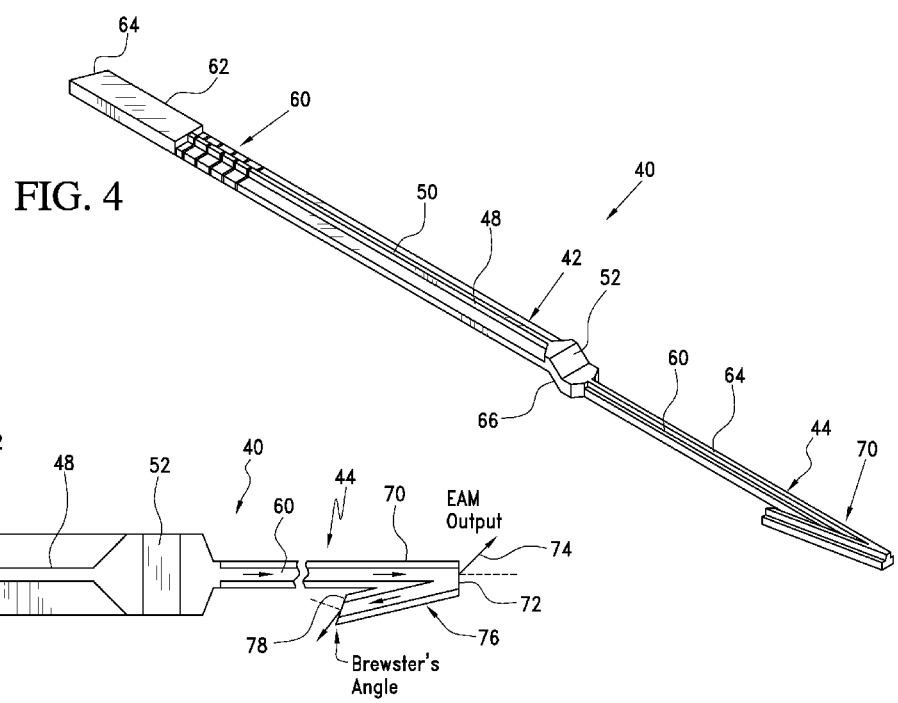

MULTI-LEVEL INTEGRATED PHOTONIC DEVICES

CROSS REFERENCE TO RELATED APPLICATIONS

This application is a Divisional under 35 U.S.C. 120 of U.S. application Ser. No. 11/105,552, filed Apr. 14, 2005, now U.S. Pat. No. 7,656,922, which claims the benefit under 35 U.S.C. 119(e) of U.S. Provisional Application No. 60/562, 231, filed Apr. 15, 2004, entitled "Multi-Level Integrated Photonic Devices," the disclosure of which is hereby incorporated herein by reference.

BACKGROUND OF THE INVENTION

The present invention relates, in general, to photonic devices, and more particularly to improved multi-level integrated photonic devices and methods for fabricating them.

In the past, semiconductor lasers were typically fabricated by growing the appropriate layered semiconductor material on a substrate through Metalorganic Chemical Vapor Deposition (MOCVD) or Molecular Beam Epitaxy (MBE) to form an active layer parallel to the substrate surface. The material was then processed with a variety of semiconductor processing tools to produce a laser cavity incorporating the active layer, and metallic contacts were then attached to the semiconductor material. Finally, laser mirror facets were formed at the ends of the laser cavity by cleaving the semiconductor material to define edges or ends of a laser optical cavity so that when a bias voltage was applied across the contacts, the resulting current flow through the active layer would cause photons to be emitted out of the faceted edges of the active layer in a direction perpendicular to the current flow.

An improvement over the foregoing process was described in U.S. Pat. No. 4,851,368, which discloses a process for forming mirror facets for semiconductor lasers by a masking and etching process that allowed lasers to be monolithically integrated with other photonic devices on the same substrate. This patent also teaches that total-internal-reflection facets can be created within an optical cavity through the fabrication of such facets at angles greater than the critical angle for light propagating within the cavity. The ability to fabricate multiple photonic devices on a single substrate led to the fabrication of complex integral optical circuits in which multiple active and passive optical devices are integrally fabricated on a single substrate. Such optical circuits may incorporate integrated lasers, waveguides, detectors, semiconductor optical amplifiers (SOA), gratings, and other optical devices.

Recently, there has been tremendous interest in developing an electroabsorption-modulated laser (EML) through the integration of a laser and an electroabsorption modulator (EAM). However, existing methods of fabricating monolithic EML devices typically have involved semiconductor regrowth steps to separately fabricate the laser and the EAM, but such methods have resulted in poor yields and high costs.

Copending U.S. patent application Ser. No. 10/226,076, filed Aug. 23, 2002, entitled "Wavelength Selectable Device" and assigned to the assignee hereof, discloses a method of incorporating monolithic structures such as an electroabsorption modulator coupled with a laser cavity on a substrate without the need for epitaxial regrowth.

Another example of an integrated EML device is described in U.S. Pat. No. 6,483,863, wherein the EML comprises two stacked asymmetric waveguides, the first waveguide forming a laser and the second waveguide forming an EAM. The two waveguides support two different modes of light propagation and are arranged so that light propagating in the first waveguide is transferred into the second waveguide via a lateral taper in the first waveguide. However, due to the use of a lateral taper to transfer light propagating in the laser to the EAM waveguide, close proximity of these two waveguides is required, resulting in a reduced confinement factor for each quantum well in the laser.

A very important factor in determining laser performance is its confinement factor $\Gamma$ for each quantum well in the laser. A smaller value of $\Gamma$ leads to higher threshold currents for lasing and results in a higher amount of dissipated heat by the laser. Reducing heat dissipation by lasers is a key requirement of modern-day lasers and is very important to a viable EML product. A modal analysis for a typical laser structure including a metal contact layer on the top, or p-side of the laser indicates a confinement factor $\Gamma$ of 2.55% for each quantum well in the laser. A modal analysis of a structure similar to that of U.S. Pat. No. 6,483,863, including both the laser and underlying EAM, but also including the p-side metals, results in a confinement factor of 1.37% due to the proximity of the EAM, which is required since the electroabsorption modulated laser (EML) is formed by transferring light propagating in the laser waveguide to the EAM waveguide via a lateral taper in the laser waveguide. The result is a laser device having suboptimal performance.

SUMMARY OF THE INVENTION

Briefly, the present invention is directed to improved integrated multilayer photonic optical circuits and to an improved process for fabricating such circuits in multiple epitaxially grown layers on a substrate. The optical circuits so fabricated are directly coupled through integrally formed etched mirrored facets to avoid the need for the close proximity of the circuit components that is required for prior EML elements, thereby providing improved performance.

More particularly, the present invention is directed to a process for fabricating integrated photonic devices on a substrate through the etching of trenches downwardly along the z-axis of the devices but also at an angle to the x, y and z axes. In accordance with a preferred form of the present invention, the trenches are etched downwardly at an angle of 45 degrees to the x axis (along the length of the laser cavity) and at an angle of 10 degrees to the y-axis.

In the preferred form of the invention, multiple layer epitaxy is used to provide an electroabsorption modulator structure on a substrate, and an optimized laser structure on the EAM structure. Vertically displaced laser and EAM devices are fabricated in these structures, to form an EML wafer wherein light travels parallel to the plane of the semiconductor substrate in both the laser and the EAM. To optically connect these devices, a first angled etched facet is fabricated to provide a first total internal reflection at the output end of the laser to cause the laser light to travel out of the laser cavity in a direction perpendicular to the plane of the semiconductor. A second angled etched facet is fabricated at the input end of the EAM to receive the light from the laser and to thereby couple the two photonic devices. A directional angled etch process is used to form the two angled facets.

In the past, trenches have only been etched vertically downward, or vertically downward with an angle to only one direction, as taught, for example, in U.S. Pat. No. 4,956,844. This patent describes an etch process for forming two total-internal-reflection facets, one at each end of a linear laser cavity, with each facet being positioned at an angle of 45° with respect to the plane of the active layer so that light propagating in the laser cavity is directed perpendicularly upwardly at one facet, resulting in surface emission at that facet, while light propagating in the laser cavity is directed perpendicularly downwardly at the other facet where it is directed to a high reflectivity stack below the laser structure.

In the present invention the facets, which function as turning mirrors, are fabricated in one Chemically Assisted Ion Beam Etching (CAIBE) procedure, by lithographically creating windows in an oxide etch-mask on the EML wafer to define the location of the etch, and then positioning the wafer at an angle to an incident ion beam while performing a deep etch to form trenches which define the facet surfaces. In accordance with the preferred form of the present invention, the trenches are etched into the wafer downwardly along the z-axis of the device and also at an angle to the x-axis, along the length of the laser cavity, and at an angle to the y-axis, perpendicular to the x and z axes; for example, the trenches are etched at an angle of 45 degrees to the x-axis and 10 degrees to the y-axis. The resulting 45-degree turning mirrors on the laser and on the EAM device lie in parallel planes displaced from each other by several micrometers and serve to efficiently couple the two optical devices with essentially no detrimental effect on the confinement factor of the laser in the presence of the adjacent EAM structure.

BRIEF DESCRIPTION OF DRAWINGS

The foregoing, and additional objects, features and advantages of the present invention will be apparent to those of skill in the art from the following detailed description of preferred embodiments thereof, taken with the accompanying drawings, in which:

FIG. 4 is a perspective view of the EML device of FIG. 3;

FIG. 5 is a diagrammatic, partial top view of the device of FIG. 4;

DETAILED DESCRIPTION OF PREFERRED EMBODIMENTS

Figure 1:
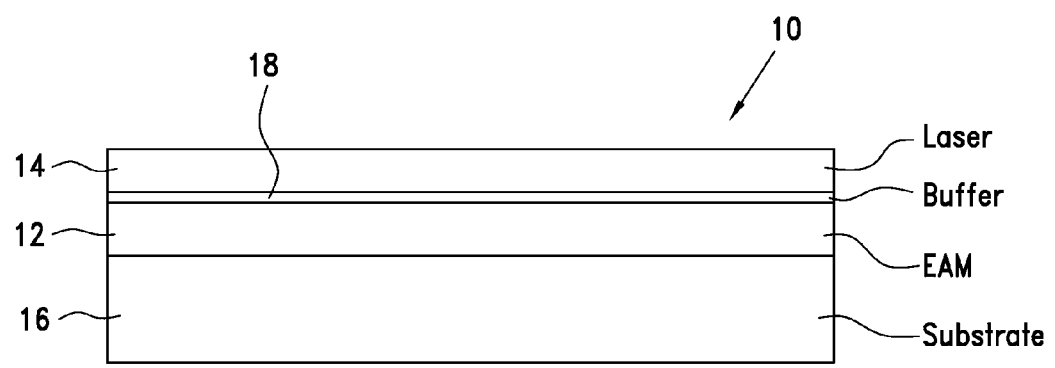
FIG. 1 shows a two layer epitaxial structure for use in fabricating an integrated optical circuit incorporating a laser and an electroabsorption modulator (EAM) in accordance with a preferred embodiment of the present invention.

Turning now to a more detailed description of the invention, multiple integrated photonic devices are fabricated on a wafer, or chip 10, illustrated in FIG. 1, to form an optical circuit with multiple functions to provide compact and cost-effective components for a variety of applications. As illustrated, the wafer 10 includes two epitaxial structures 12 and 14 on a common substrate 16, with the first structure 12 being positioned on the substrate 16 and the second structure 14 being positioned on top of the first structure. A buffer layer 18 may be incorporated between the two structures 12 and 14 to provide electrical isolation. Furthermore, the thickness of the buffer layer is chosen to optically optimize both the laser and EAM structure. The epitaxial structures 12 and 14, as well as buffer layer 18, are grown, for example, in a single Metalorganic Chemical Vapor Deposition (MOCVD) growth, and no epitaxial re-growth is required for the device of the present invention. In the illustrated embodiment, the layers in the first structure are doped to cause it to function as a semiconductor electroabsorption modulator (EAM), and the layers in the second structure are doped to produce a semiconductor laser. The EAM structure is epitaxially deposited on the substrate and the laser structure is thereafter epitaxially deposited on the EAM structure in the illustrated embodiment.

The structures on the substrate 16 may be formed, for example, from a suitably doped type III-V compound, or an alloy thereof. The EAM structure 12 may be a succession of layers deposited by an epitaxial deposition process such as Metalorganic Chemical Vapor Deposition (MOCVD). Typically, these layers may include the following layers on an InP substrate: p-doped InP buffer layer, p-doped InGaAs p-contact layer, p-doped InP transition layer, InGaAsP quantum wells and barriers, n-doped InP layer, and an n-doped InGaAs n-contact layer. The laser structure 14 also may be a succession of layers, deposited by the MOCVD on the top surface of structure 12, to form an optical cavity incorporating an active region. Although many types of laser cavities can be fabricated in accordance with the invention, the invention will be described herein in terms of ridge lasers, for convenience. As is typical for solid state ridge lasers, the structure 14 includes upper and lower cladding regions formed from lower index semiconductor material, for example InP, than is used in the central active region, which may be formed with In AlInGaAs-based quantum wells and barriers. A transition layer of InGaAsP may be formed in addition to a p-doped InGaAs contact layer on the top part of structure 14 to provide an ohmic contact with a top metal layer, which is deposited on the structure 14, for connecting the laser to a bias source. The quantum wells in the EAM are designed to have a higher bandgap than the quantum wells in the laser.

The structures 12 and 14 may share some of the deposited layers, so that the interface between the structures is common to both.

Figure 2A:
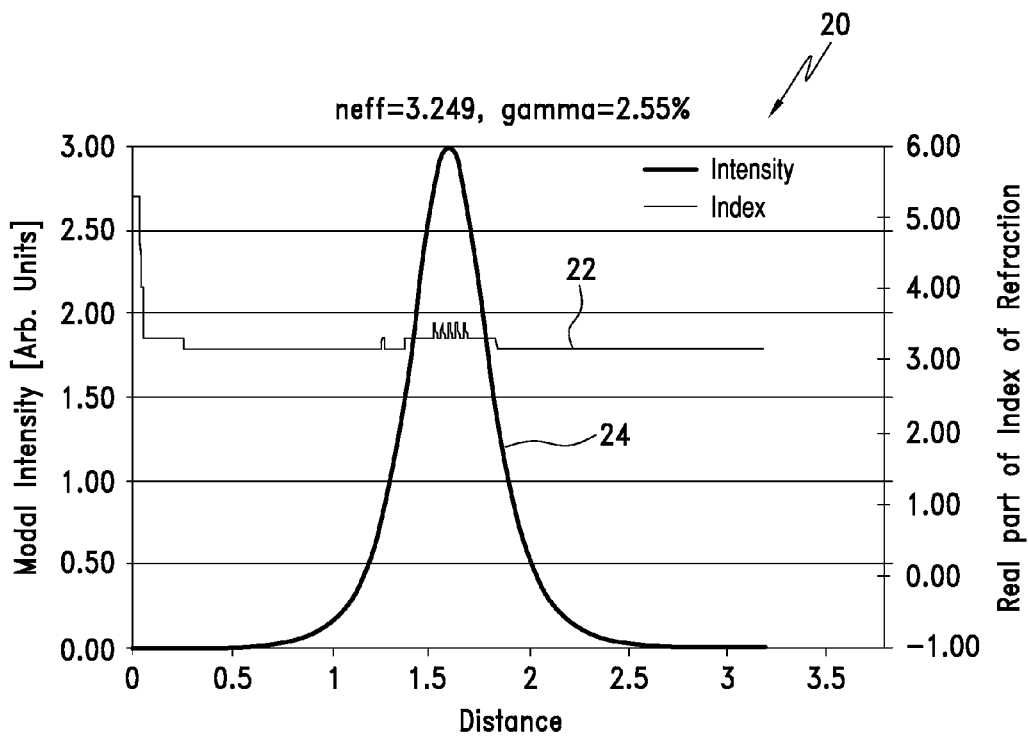
FIG. 2 (a) illustrates a modal analysis for a laser without an EAM structure underneath it.
FIG. 2(b) illustrates a modal analysis for a prior art waveguide structure incorporating two stacked asymmetric waveguides.
FIG. 2(c) illustrates a modal analysis for a waveguide structure in accordance with the present invention.

As discussed above, the confinement factor $\Gamma$ for each quantum well in a laser is a very important factor in determining laser performance. A smaller value of $\Gamma$ leads to higher threshold currents for lasing and results in a higher amount of dissipated heat by the laser. Reducing heat dissipation by lasers is a key requirement of modern-day lasers and is very important to a viable EML product. A modal analysis for a typical laser structure, for example a laser similar to that described in U.S. Pat. No. 6,483,863, without the presence of an EAM underneath but including a metal contact layer on the top, or p-side of the laser, is illustrated by graph 20 in FIG. 2(a). In this analysis, variations in the index of refraction of the laser are illustrated by curve 22, while the corresponding modal intensity is indicated by curve 24. The resulting confinement factor $\Gamma$ for each quantum well in this laser is 2.55%.

Figure 2B:
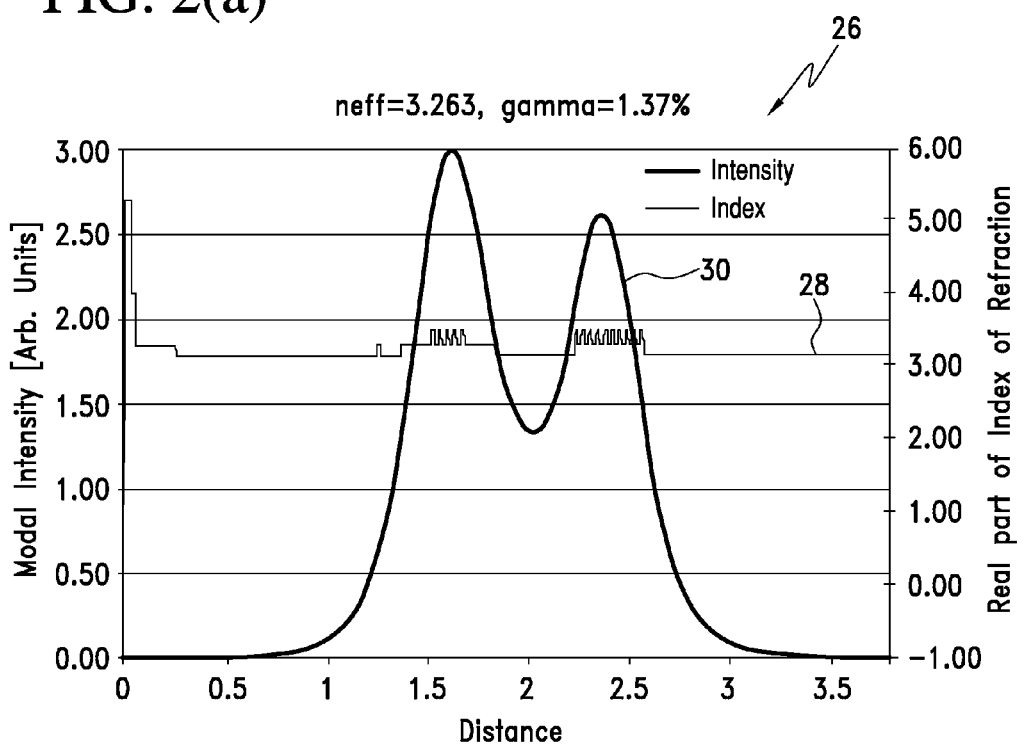

A modal analysis of a structure similar to that of U.S. Pat. No. 6,483,863, including both the laser and the underlying EAM, and also including the p-side metals, gives rise to the solution shown by graph 26 in FIG. 2(b), wherein curve 28 illustrates variations in the index of refraction of the laser and curve 30 indicates corresponding variations in modal intensity. In this illustration the $\Gamma$ is reduced to 1.37%, due to the required proximity of the EAM, the proximity between the laser and the EAM being required since the electroabsorption modulated laser (EML) is formed by transferring light propagating in the laser waveguide to the EAM waveguide via a lateral taper in the laser waveguide.

Figure 2C:
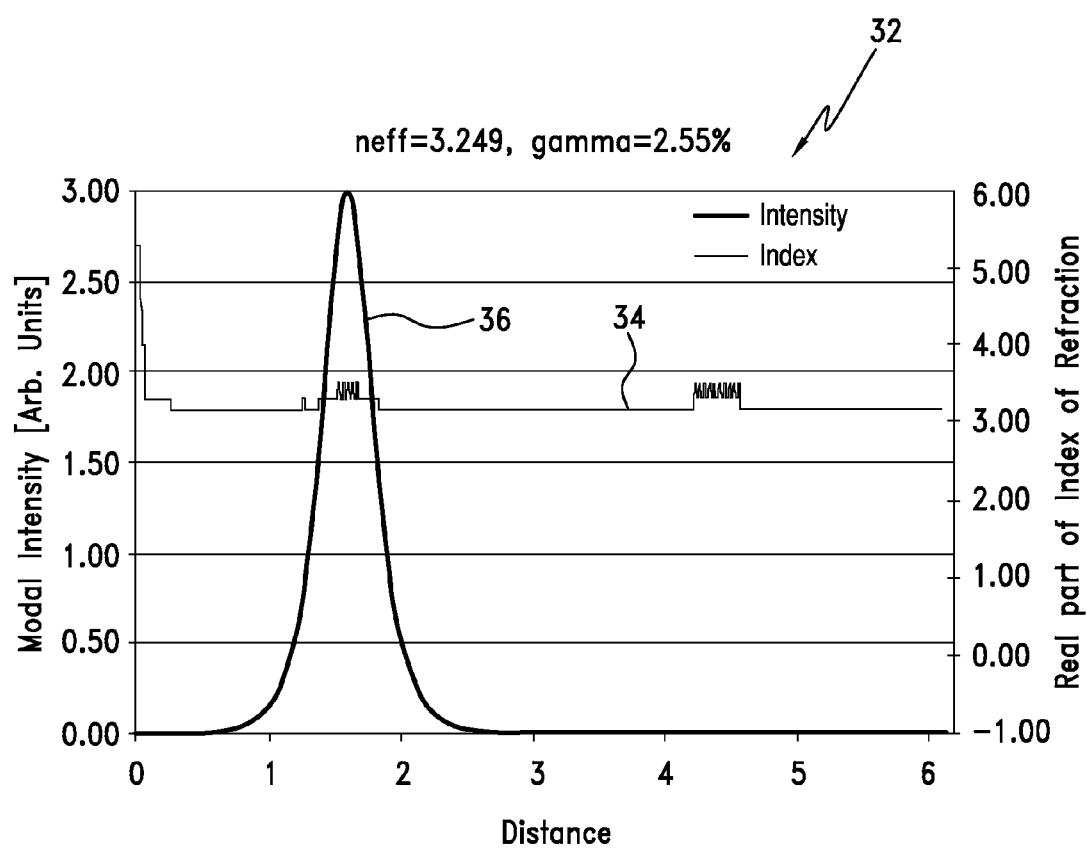

A modal analysis of an EML device constructed in accordance with the present invention is illustrated by graph 32 in FIG. 2(c). As will be described in detail below, this device does not require the same proximity of the laser and EAM as is required in devices such as those described in U.S. Pat. No. 6,483,863 in order to attain the desired optical coupling. Therefore, improved confinement of the laser is attained by inserting a buffer between the laser and the EAM layer. This is accomplished, for example, by providing an additional thickness of 2 μm in the bottom cladding layer of the laser. In the modal analysis of such a device in FIG. 2(c), curve 34 illustrates the index of refraction of the laser, while curve 36 illustrates the corresponding modal intensity for the laser of the invention. This results in a confinement factor of 2.55%. As shown by this analysis, there is essentially no detrimental impact on the $\Gamma$ of the laser due to the presence of the EAM underneath, and there is essentially no degradation in the performance of either the laser or the EAM for devices constructed in accordance with the invention.

Figure 3:
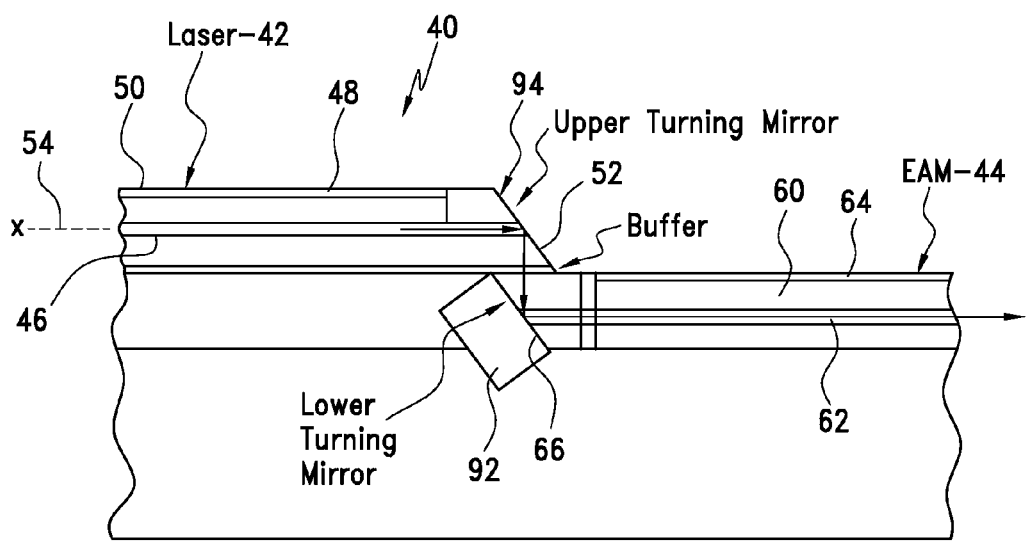
FIG. 3 is a diagrammatic, partial side elevation of an etched facet electroabsorption-modulated laser (EML) optical circuit incorporating a downward-emitting laser and an integrated surface-receiving EAM, fabricated from the structure of FIG. 1 in accordance with the invention.

Turning now to a more detailed description of the invention, an EML device 40, which is fabricated in the wafer 10 of FIG. 1, is illustrated in the diagrammatic partial side view of FIG. 3 and in the top perspective view of FIG. 4, to which reference is made. The EML 40 is based on a design incorporating a laser structure 42 in layer 14 that is vertically displaced from an EAM structure 44 formed in layer 12. As illustrated, the downward-emitting laser 42 is a ridge-type laser having an optical cavity, or waveguide, that includes an active region 46 and a ridge 48 covered by a top electrode layer 50. At its output end the laser includes an upper turning mirror 52 which is a totally internally reflective facet at an angle of about 45° with respect to the longitudinal axis, or x axis, 54 of the laser and also at a 45° angle with respect to the vertical z axis of the device. At the opposite end of the laser are suitable filters 60 and a monitoring photodetector 62 that terminates in a facet 64 at the Brewster angle. Such a surface emitting laser is described in detail in copending U.S. application Ser. No. 10/958,069, filed Oct. 5, 2004, entitled "Surface Emitting and Receiving Photonic Device", and assigned to the assignee hereof, the disclosure of which is hereby incorporated herein by reference. In the preferred form of the invention, the buffer layer 18 is an extension, or thickening, of the cladding layer which is a part of the laser structure, as described above. The laser is fabricated in the layer 14 by masking and etching techniques known in the art.

The surface-receiving EAM 44 is a ridge-type device fabricated in layer 12 of the wafer, again by known masking and etching techniques, and incorporates an optical cavity, or waveguide, having a ridge portion 60 and an active region 62. An electrode layer 64 is placed on the top surface of the EAM structure for the application of a modulating voltage. The input end of the EAM structure includes a second, or lower, turning mirror 66 which consists of a totally internally reflecting facet at an angle of about 45° to the x axis 54 and to the vertical z axis of the device. The EAM mirror 66 is below, vertically aligned with, and substantially parallel to the upper laser mirror 52, so that light propagating in the laser is deflected by mirror 52 and is emitted from the bottom surface of the laser. The emitted light is directed onto the EAM device, where it is directed by mirror 66 along the axis of the EAM cavity. As will be described below, both the mirror 52 and the mirror 66 are also at an angle of about 10° with the y axis to facilitate the fabrication of the device.

Strong optical coupling between the laser and the EAM is provided by the two 45-degree turning mirrors 52 and 66. A bias voltage (not shown) is applied to an electrode layer 50 on the top surface of the laser, in known manner, to cause laser light to propagate in the laser cavity. This light propagates horizontally in the laser cavity until it impinges on the 45-degree etched facet 52, where total internal reflection occurs and causes the downward-emission from the laser. In effect, the direction of the laser beam is changed by 90 degrees. Then another 45 degree etched facet causes the laser beam to be changed by another 90 degrees and directs it into the EAM. Angles other than 45 degrees can also be used; however, angles above the critical angle are preferred to allow total internal reflection.

The perspective view of FIG. 4 and the top plan view of FIG. 5 illustrate the EML structure 40 described above without the underlying substrate, for clarity, and also illustrate the output end 70 of the EAM structure. As shown, the EAM preferably incorporates a partially emissive output facet 72 that emits a portion of the received light as a modulated light beam 74 and reflects the remaining light into a folded cavity portion 76. The cavity portion is terminated at its distal end by a facet 78, which is at the Brewster angle to prevent internal reflection. An EAM structure where back reflection is minimized by the provision of a facet at or near the Brewster angle at the distal end is described in copending U.S. patent application Ser. No. 10/802,734, filed Mar. 18, 2004, assigned to the assignee hereof, the disclosure of which is hereby incorporated herein by reference.

The laser 42 is fabricated to produce single-longitudinal-mode behavior, and for this purpose preferably makes use of etalons, as taught in copending U.S. patent application Ser. No. 10/929,718, filed Aug. 31, 2004, entitled "Single Longitudinal Mode Laser Diode" and assigned to the assignee hereof, the disclosure of which is hereby incorporated herein by reference. Etalons are introduced in the laser and EAM structures to modify the optical behavior and to provide electrical isolation. The preferred location of these etalons for electrical isolation is in the proximity of the two turning mirrors. However, the single-longitudinal-mode behavior can be obtained by a variety of different structures, known to experts in the field, one such example being a distributed feedback (DFB) laser.

In accordance with the present invention, etched trenches that extend downward along, and at an angle to, the z-axis of the EML device described above and also extend at an angle to both the x-axis and y-axis of the device are used to fabricate the upper and lower turning mirrors so that they lie in parallel, closely spaced planes in vertical alignment with each other. In the past, trenches have only been etched vertically downward, or vertically downward with an angle to only one direction, as taught, for example, in U.S. Pat. No. 4,956,844. In that patent, an etch process forms two total-internal-reflection facets, one at each end of a linear laser cavity, with each facet being positioned at an angle of 45° with respect to the plane of the active layer. In that device, light propagating in the laser cavity is directed perpendicularly upwardly at one facet, resulting in surface emission at that facet, while the second facet, at the other end of the cavity, directs the light perpendicularly downwardly to a high reflectivity stack below the laser structure. In the present invention, however, parallel facets are fabricated by etching trenches along the direction of the z axis of the device and at angles to the x, y and z axes.

Figure 6:
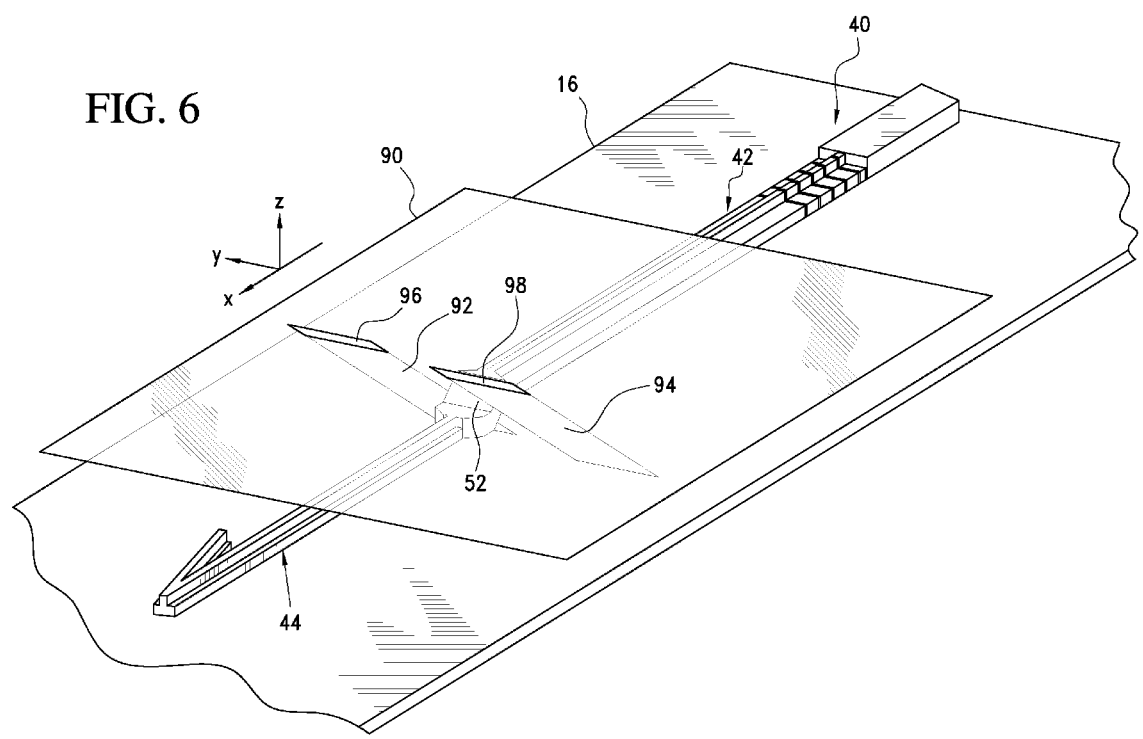
FIG. 6 is a top perspective view taken from the EAM end of the EML of FIG. 3, illustrating the location and direction of angle-etched trenches that form the angled facets in the EML device of the invention.
Figure 7:
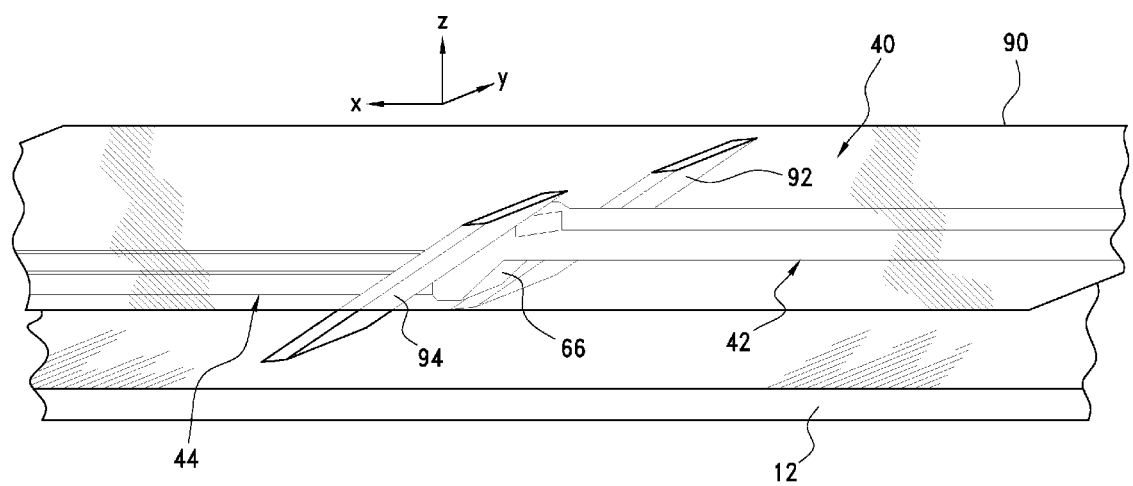
FIG. 7 is a top perspective view taken from the laser end of the EML of FIG. 3, illustrating the location and direction of angle-etched trenches that form the angled facets in the EML device of the invention.
Figure 8:
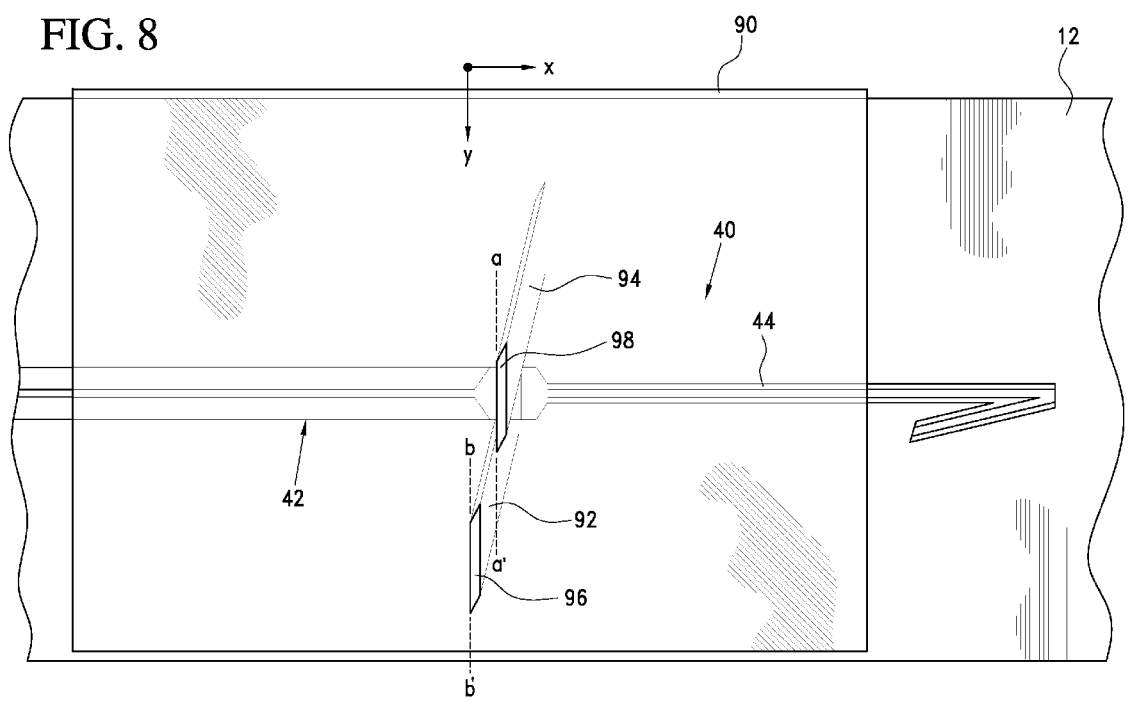
FIG. 8 is a top plan view of the EML of FIG. 3, illustrating the location and direction of angle-etched trenches that form the angled facets in the EML device of the invention.

A preferred process for fabricating the upper and lower facets of the EML device 40 is illustrated in FIGS. 6-8, to which reference is now made. In each of these Figures, the EML device 40 of the preceding Figures is illustrated, with an imaginary plane 90 being included for reference purposes. This plane 90 is located at the level of the top of the laser structure 42, corresponding to the surface of the wafer, and is parallel to the surface of the substrate and to the active layers of the laser and EAM structures. The z axis of the plane is perpendicular to the plane and to the surface of the wafer; the x-axis of the plane 90 is parallel to the x-axis 54 of the laser (FIG. 3); and the y-axis of the plane is mutually perpendicular to the x and z axes, as illustrated in the Figures.

In accordance with the preferred process, the facets 52 and 66 are formed by etching two parallel trenches 92 and 94 in the wafer, using suitable masking, with a directional etch such as a CAIBE etch. In a first masking step, apertures 96 and 98 are formed on the wafer surface at locations corresponding to those shown on the plane 90. The surface of the wafer 10 is coated with a mask material, such as $SiO_2$, and photolithography followed by reactive ion etching (RIE) is performed to define the apertures 96 and 98 in the mask. The wafer is then etched in a chemically assisted ion beam etcher (CAIBE) by positioning the sample so that the ion beam is directed downwardly, generally in the direction of the z axis but also at angles to it and to the x and y axes. The apertures face toward the ion beam and the sides of the trenches 92 and 94 are then formed parallel to the ion beam. After this step, $SiO_2$ is deposited and photolithography followed by RIE and CAIBE are performed to form the vertical facets such as 64, 72, and 56. Facet 56 is preferably positioned between section 52 and the EAM 44. In the case of a DFB laser, facet 56 can be eliminated. The ridge structure is defined and metallizations added to provide a functional EML.

The trenches are etched downwardly, generally along the z-axis but at a 45° angle to that axis, and also at a 45° angle to the plane of the x-y axes and thus also to the x-axis. In the example illustrated here, the trenches are also etched at a 10° angle to the y-axis. The etched trenches extend the width of the corresponding apertures 96 and 98 in order to extend across the desired width of the turning mirrors 52 and 66, and extend only as deep as is required to form the mirror surfaces. As discussed above, the turning mirrors are fabricated in one CAIBE process step, by lithographically creating the apertures 96 and 98 in an oxide etch-mask to define the location of the etch and then positioning the wafer at an angle to the incident ion beam. The 45-degree turning mirrors 52 and 66 are to lie in parallel planes displaced from each other by several micrometers. The trenches 92 and 94 intersect with the plane 90 at the surface of the wafer at the respective apertures 96 and 98. Parallel lines aa' and bb' illustrated in plane 90 in FIG. 8, identify the sides of the apertures 98 and 96, respectively. Line cc' in FIG. 8 is parallel to bb' and defines the other side of aperture 96, as shown in FIG. 8. A line drawn from the center of the upper 45-degree turning mirror 52 to any point on the line aa' determines the location of the oxide mask window 98, and also determines the compound angle at which the wafer must be oriented relative to the incident ion beam during the CAIBE etch. Similarly, the location of the oxide mask window 96 for etching the lower turning mirror is determined by the intersection of a line extending from the center of the lower turning mirror 66 at the same compound angle, with the line cc' in the surface 90. The particular compound angle used for the CAIBE etch is a compromise between two design parameters: maximizing the overlap of the propagating optical mode and the surface area of the turning mirror, and minimizing the etch depth of the CAIBE etch.

Although lines aa', bb' and cc' have been shown to be straight, it will be understood that these lines may be curved. Furthermore, although lines aa' and bb' are shown to be parallel, they may deviate from being parallel.

Although the EML structure is illustrated with a downward-emitting laser and with an EAM that is surface-receiving, it will be understood that an upward surface-emitting laser could also be coupled with a downward-receiving EAM using the process described herein.

Although the present invention has been illustrated in terms of preferred embodiments, it will be understood that variations and modifications may be made without departing from the true spirit and scope thereof as set out in the following claims.

What is claimed is:

1. A method of fabricating a semiconductor photonic device having mutually perpendicular x, y, and z axes, comprising:
   providing a substrate having an x-axis and a y-axis defining a plane along a surface of said substrate and a height defining a z-axis of said substrate;
   depositing a multilayer epitaxial structure on said substrate, said multilayer epitaxial structure containing a first and second waveguide structures for said photonic device, at least one of said first and second waveguide structures having a longitudinal axis parallel to said x-axis of said substrate, and said second waveguide structure being located above said first waveguide structure; and
   etching at least a first trench downwardly through a to surface of said multilayer epitaxial structure with a component along a z-axis of said substrate, said first trench being etched at non-perpendicular angles to both said x- and y-axes of said substrate and having a side that passes across a first one of said first and second waveguide structures at a non-perpendicular angle to the y axis and thereby forms a reflective facet defining a distal end of said first one of said first and second waveguide structures that reflects light toward a second one of said first and second waveguide structures.

2. The method of claim 1, wherein said etching is by Chemically Assisted Ion Beam Etching (CAIBE).

3. The method of claim 1, wherein said first one of said waveguide structures across which said trench is etched includes a first, a second and a third layer, wherein said first layer is a lower cladding layer, said second layer is an active layer, and the third layer is an upper cladding layer, said first trench being etched into said second and third layers.

4. The method of claim 3, wherein said semiconductor photonic device includes a laser.

5. The method of claim 4, wherein said laser is a DFB laser.

6. The method of claim 5, wherein said etching is by CAIBE.

7. A method of fabricating a semiconductor photonic device having mutually perpendicular x, y, and z axes, comprising:
   providing a substrate having an x-axis and a y-axis defining a plane along a surface of said substrate and a height defining a z-axis of said substrate;
   depositing a first Electroabsorption modulator (EAM) epitaxial structure on said substrate, said EAM epitaxial structure containing a first waveguide structure for an EAM in said photonic device, said first waveguide structure being elongated parallel to said x-axis of said substrate;

depositing a laser epitaxial structure on said first EAM epitaxial structure, said laser epitaxial structure containing a second waveguide structure for a laser in said photonic device, said second waveguide structure being elongated parallel to said x-axis of said substrate; and etching at least a first trench downwardly into said laser epitaxial structure with a component along a z-axis of said substrate, said first trench being etched at non-perpendicular angles to both said x and y axes of said substrate.

8. The method of claim 7, wherein said first trench is also etched into said EAM epitaxial structure.

9. The method of claim 8, wherein said etching is by CAIBE.

10. The method of claim 7, wherein said laser is a single longitudinal mode laser.

11. The method of claim 10, further comprising etching at least a second trench downwardly into said laser epitaxial structure and said EAM epitaxial structure with a component along a z-axis of said substrate, said second trench being etched at non-perpendicular angles to both x- and y-axes of said substrate.

12. The method of claim 11, wherein said first trench forms a first facet that provides total internal reflection for the laser light impinging upon it.

13. The method of claim 12, wherein said second trench forms a second facet that provides total internal reflection for laser light impinging upon it and directing it to said EAM.

14. The method of claim 13, wherein said etching is by CAIBE.

15. The method of claim 13, wherein said EAM further comprises a partially emitting output facet.

16. The method of claim 15, wherein said EAM further comprises a facet terminating at a distal end.

17. The method of claim 16, wherein said facet at said distal end is positioned at a Brewster angle to prevent back reflection.

18. The method of claim 1, further comprising etching at least a second trench through said top surface of said multilayer epitaxial structure.

19. The method of claim 1, wherein said reflective facet provides total internal reflection for light impinging upon it.

20. The method of claim 2, wherein said etching is carried out by first forming a mask on said top surface of said multilayer epitaxial structure; forming an aperture in said mask defining a shape of said trench and a location on said top surface where said trench is to begin; and, directing said ion beam down through said aperture into said multilayer epitaxial structure at said non-perpendicular angle with respect to each of said x and y axes.

21. The method of claim 6, wherein said etching is carried out by first forming a mask on said top surface of said multilayer epitaxial structure; forming an aperture in said mask defining a shape of said trench and a location on said top surface where said trench is to begin; and, directing said ion beam down through said aperture into said multilayer epitaxial structure at said non-perpendicular angle with respect to each of said x and y axes.

22. The method of claim 9, wherein said etching is carried out by first forming a mask on a top surface of said epitaxial structure; forming an aperture in said mask defining a shape of said trench and a location on said top surface where trench is to begin; and, directing said ion beam down through said aperture into said epitaxial structure at said non-perpendicular angle with respect to each of said x and y axes.

23. The method of claim 14, wherein said etching is carried out by first forming a mask on a top surface of said laser epitaxial structure; forming first and second apertures in said mask each defining a shape of said first and second trenches, and first and second locations on said top surface where said first and second trenches are to begin, respectively; and, directing said ion beam down through said first and second apertures into said epitaxial structure at said non-perpendicular angle with respect to each of said x and y axes.

* * * * *